United States Patent
Nakatsuka et al.

(10) Patent No.: US 6,943,376 B2
(45) Date of Patent: Sep. 13, 2005

(54) ELECTRODE FOR P-TYPE SIC

(75) Inventors: Osamu Nakatsuka, Nagoya (JP); Ryohei Konishi, Tokyo (JP); Ryuichi Yasukochi, Kyoto (JP); Yasuo Koide, Tsukuba (JP); Masanori Murakami, Kyotanabe (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/415,914

(22) PCT Filed: Sep. 2, 2002

(86) PCT No.: PCT/JP02/08883

§ 371 (c)(1),
(2), (4) Date: May 5, 2003

(87) PCT Pub. No.: WO03/023837

PCT Pub. Date: Mar. 20, 2003

(65) Prior Publication Data

US 2004/0016929 A1 Jan. 29, 2004

(30) Foreign Application Priority Data

Sep. 6, 2001 (JP) .................................. 2001-270771

(51) Int. Cl.[7] .................. H01L 33/00; H01L 21/28; C04B 41/90

(52) U.S. Cl. .................. 257/77; 257/13; 257/747; 257/748; 257/749

(58) Field of Search ............ 257/13, 55, 77, 257/648, 747, 748, 749

(56) References Cited

U.S. PATENT DOCUMENTS

| 5,323,022 A | 6/1994 | Glass et al. |
| 5,338,944 A | 8/1994 | Edmond et al. |
| 5,409,859 A | 4/1995 | Glass et al. |
| 5,739,554 A | 4/1998 | Edmond et al. |
| 6,120,600 A | 9/2000 | Edmond et al. |
| 2001/0002705 A1 | 6/2001 | Friedrichs et al. |

FOREIGN PATENT DOCUMENTS

| JP | 63-283014 | 11/1988 | |
| JP | 1-268121 | 10/1989 | |
| JP | 4-85972 | 3/1992 | |
| JP | 04085972 | 3/1992 | |
| JP | 04085972 A | * 3/1992 | ........... H01L/33/00 |
| JP | 5-13812 | 1/1993 | |
| WO | WO 94/06153 | 3/1994 | |

OTHER PUBLICATIONS

Translation of JP 04085972 A, made by the Ralph McElroy Translation Co. on Sep. 15, 2004.*
International Search Report dated Dec. 3, 2002 and English Translation of the degree of relevance found.
Korean Office Action, dated Feb. 28, 2005, along with the Japanese translation thereof.
Liu, et al., "Thermally Stable Ohmic Contacts to 6H–and 4H–P–Type SiC", Jun. 18, 1998, pp. 88–92.
Vassilevski, et al., "Phase formation at rapid thermal annealing of Al/Ti/Ni ohmic contacts on 4H–SiC," Materials Science and Engineering, vol. 80, No. 1–3, Mar. 22, 2001, pp. 370–373.
Gao, et al., "Improved ohmic contacts on 1–4, 9–14, n–type 4H–SiC," Solid State Electronics, , vol. 44, No. 10, Oct. 1, 2004, pp. 1875–1878.
Supplemental European Search Report dated Jun. 16, 2005.

* cited by examiner

Primary Examiner—Minhloan Tran
Assistant Examiner—Thomas L. Dickey
(74) Attorney, Agent, or Firm—McGinn & Gibb, PLLC

(57) ABSTRACT

An object of this invention is to provide an electrode for p-type SiC which can provide improved surface morphology and less thermal damage for a semiconductor crystal layer due to formation of an electrode. In this invention, a p-type electrode is manufactured to contain at least one selected from the group consisting of nickel (Ni), cobalt (Co), palladium (Pd) and platinum (Pt).

11 Claims, 5 Drawing Sheets

ELECTRODE FOR P-TYPE SIC

TECHNICAL FIELD

This invention relates to a silicon carbide (SiC) device, and more particularly to an electrode for p-type SiC, which is employed in an SiC device.

BACKGROUND ART

It has been expected that silicon carbide (SiC) is applied to a high frequency electric power device, a high temperature device and an optoelectronics device, and its investigation for actual use is now underway. The p-electrode for the SiC device, i.e. an ohmic electrode for p-type SiC is generally formed of TiAl composed of titanium (Ti) and aluminum (Al) (see JP-A-5-13812).

Generally, in many cases, the device needs an ohmic electrode. However, in the device using compound semiconductor, generally, an ohmic contact between a semiconductor layer and an electrode cannot be obtained without being subjected to heat treatment. Only provision of a metallic layer exhibits a Schottky barrier. The ohmic contact formed by the heat treatment provides greatly different contact resistances according to a semiconductor material, an electrode material, a heat treatment temperature, a heat treatment time, etc.

TiAl, which is presently expected as a material for a low resistance ohmic contact, can provides very low resistance. However, in order to realize such low resistance, heat treatment at a high temperature for a long time as well as a large amount of Al is required. This leads to the problems of deterioration of a device function, a device life, etc. due to deterioration of surface morphology and thermal damage for a semiconductor crystal layer.

This invention has been accomplished in order to attain the above problems, and an object of this invention is to provide an electrode for p-type SiC which can provide improved surface morphology and less thermal damage for a semiconductor crystal layer due to formation of an electrode.

DISCLOSURE OF THE INVENTION

The inventors of this application devoted theirselves to investigation in order to, and accomplished the following inventions.

An electrode for p-type SiC contains a first electrode material of at least one selected from the group consisting of nickel (Ni), cobalt (Co), palladium (Pd) and platinum (Pt).

The electrode for p-type SiC having the above configuration can provide an ohmic property and improved flatness of the electrode surface by the heat treatment at a lower temperature than before. The above electrode for p-type SiC provides the ohmic property through the heat treatment in a wide range, for example by that for a short time at a high temperature. This reduces the thermal affect on the semiconductor crystal layer due to the formation of the electrode. Thus, by using the electrode for p-type SiC according to this invention, an SiC device with an excellent device performance can be manufactured.

In this invention, the electrode for p-type SiC refers to the electrode formed on a p-type SiC semiconductor layer. The type of the p-type SiC semiconductor to which the electrode for p-type SiC according to this invention is applied should not be particularly limited, but includes 6H type, 15R type, 21R type, 3C type, etc. as well as the 4H type which is adopted in the embodiment described later. The kind of the device to which the electrode for p-type SiC according to this invention is applied should not be particularly limited, but may be various devices which are employed in a high frequency power device, a high temperature device, an optoelectronics device, etc.

As the first electrode material, nickel or cobalt is particularly preferable because nickel or cobalt reacts with Si at a relatively low temperature.

The electrode for p-type SiC according to this invention preferably further contains the second electrode material of aluminum (Al) in addition to the first electrode material. The containing of Al reduces the contact resistivity and provides the electrode for p-type SiC with an excellent ohmic property.

The electrode for p-type SiC according to this invention preferably further contains the third electrode material of titanium (Ti). Namely, the electrode preferably contains the first electrode material of e.g. nickel (Ni), second electrode material of aluminum (Al), and third electrode material of titanium (Ti). The containing of the third electrode material of titanium (Ti) further reduces the contact resistivity.

The electrode for p-type SiC according to this invention preferably includes a layer of the first electrode material (hereinafter referred to as a first electrode material layer). More preferably, the first electrode material layer is formed in contact with the p-type SiC semiconductor layer. For example, by forming the first electrode material layer on the p-type SiC semiconductor layer, subsequently stacking the layer of the other electrode material thereon and heat-treating these layers, the electrode for p-type SiC according to this invention can be manufactured.

In the case where the electrode for p-type SiC contains the second electrode material as well as the first electrode material, the electrode for p-type SiC according to this invention preferably includes the first electrode material layer and a layer of the second electrode material (hereinafter referred to as a second electrode material layer). In other words, in the manufacturing process, the first electrode material layer and the second electrode material layer are preferably formed. The order of stacking the first material layer and the second material layer should not be particularly limited, but the first electrode material layer and the second electrode material layer are preferably stacked in order from the side of the p-type SiC semiconductor layer. Like the above case, the first electrode material layer is preferably formed in contact with the p-type semiconductor layer. A layer of the other material may be located between the first electrode material layer and the second electrode material layer. A plurality of layers of the first electrode material layer and/or the second electrode material layer may be formed. For example, the first electrode material layer, the second electrode material layer and the first electrode material layer may be stacked in order from the side of the p-type SiC semiconductor layer to constitute the electrode for p-type SiC according to this invention.

In the case where the electrode for p-type SiC contains the first electrode material, second electrode material and third electrode material, the electrode for p-type SiC according to this invention preferably includes the first electrode material layer, second electrode material layer and a layer of the third electrode material (hereinafter referred to as a third electrode material layer). In other words, in the manufacturing process, the first electrode material layer, second electrode material layer and third electrode material layer are preferably formed. The order of stacking these layers should not be particularly limited, but the first electrode material layer, third electrode material layer and second electrode material layer are preferably stacked in order from the side of the p-type SiC semiconductor layer. Like the above cases, the first electrode material layer is preferably formed in contact with the p-type semiconductor layer. A layer of the other material may be located between the first electrode material layer and the third electrode material layer, and/or between the third electrode material layer and the second electrode material layer. A plurality of layers of the first electrode material layer, third electrode material layer and/or the second electrode material layer may be formed.

The method of forming the first, the second and the third electrode layer should not be limited, but can be implemented by molecular beam epitaxy (MBE), sputtering, resistive heating, etc.

The electrode for p-type SiC according to this invention is manufactured by stacking the above electrode material layer (and other layers) on the p-type SiC semiconductor layer and thereafter heat-treating these layers. Prior to forming the electrode material layer, the p-type SiC semiconductor is preferably washed (e.g. chemically washed). This intends to stack the electrode materials in a desired state. The heat-treatment for the p-type SiC is carried out in order to form the ohmic contact between the p-type SiC semiconductor layer and the electrode for p-type SiC according to this invention. The heating temperature and the heating time are adjusted as required to provide an improved ohmic contact. The heating temperature may be e.g. 400° C.–1100° C., preferably 600° C.–900° C., more preferably 700° C.–850° C. and most preferably about 800° C. On the other hand, the heating time may be e.g. 2 min.–100 min., preferably 2 min.–50 min. and more preferably 5 min.–30 min. Incidentally, the heating is preferably carried out in a vacuum state. The heating can be carried out in an atmosphere of inert gas. The inert gas may be nitrogen gas, helium gas, argon gas, etc.

BRIEF DESCRIPTION OF THE DRAWINGS

In FIG. 2, symbols are referred to as no intermediate layer (○), Al 10 nm (□), Al 40 nm (◇) and Al 120 nm (△).

■: Ni (25 nm)/Ti(50 nm)/Al(300 nm), 800° C., 10 min,
▲: Ni (44 nm)/Al(53 nm), 800° C., 10 min,
●: Ti (50 nm)/Al(300 nm) 800° C., 2 min.

Figure 4:
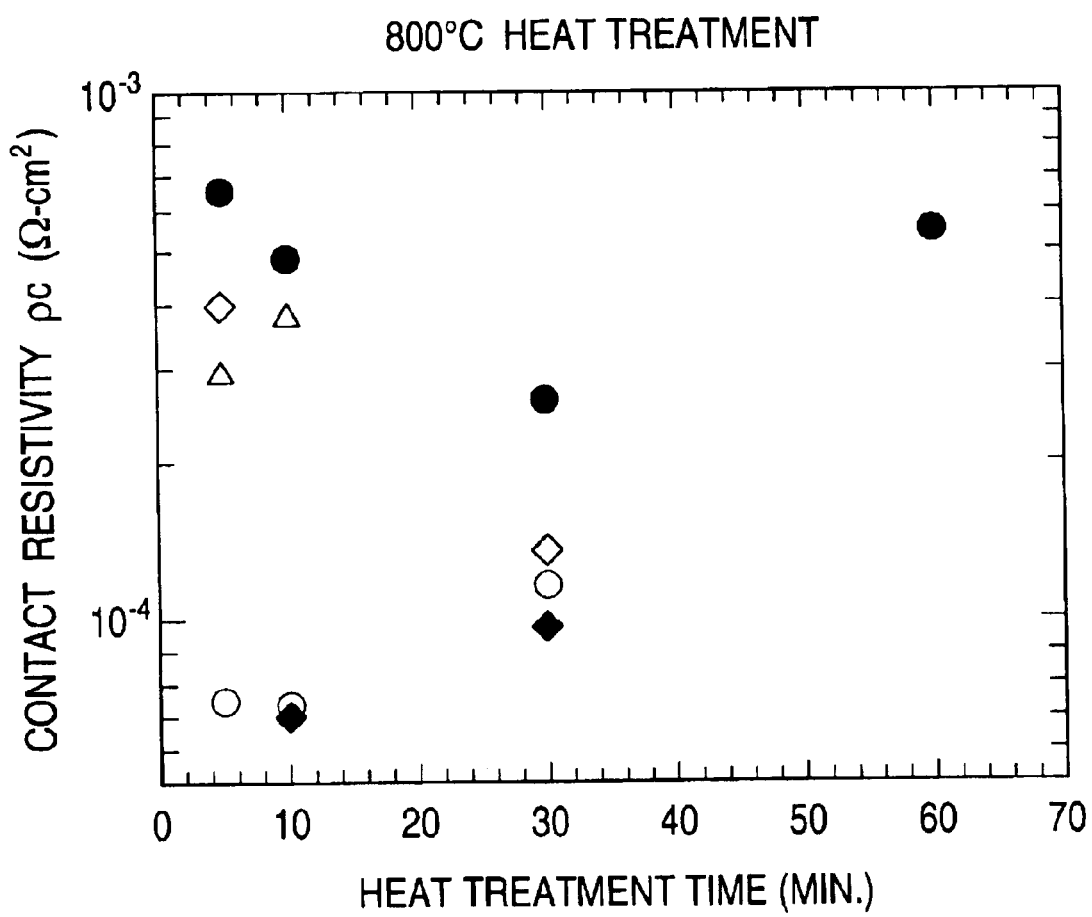

FIG. 4 is a graph showing the result of Experiment 4, which exhibits changes in the contact resistivity ($\rho c$) when differences in the film thickness of a Ni layer and Ti layer are changed in a sample having a laminated structure of Ni/Ti/Al.
△: Ni(8 nm)/Ti(50 nm)/Al(300 nm)
◇: Ni(15 nm)/Ti(50 nm)/Al(300 nm)
◆: Ni(25 nm)/Ti(50 nm)/Al(300 nm) (the above samples have Al concentration of $3.0 \times 10^{18}$ cm$^{-3}$)
●: Ni(8 nm)/Ti(50 nm)/Al(300 nm)
○: Ni(15 nm)/Ti(50 nm)/Al(300 nm) (the above samples have Al concentration of $8.1 \times 10^{18}$ cm$^{-3}$)

Figure 5:
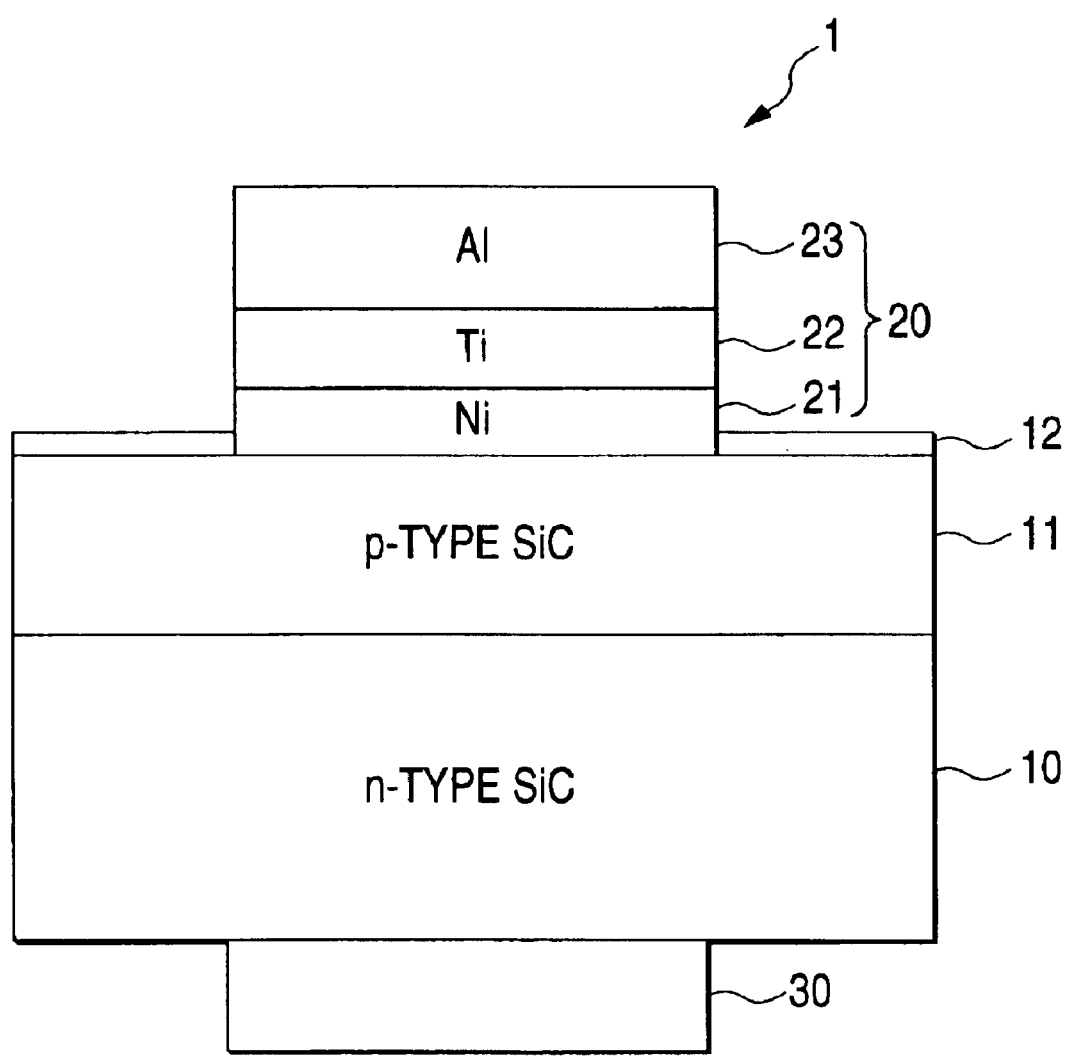

FIG. 5 is a schematic view of an SiC device 1 according to an embodiment of this invention.

BEST MODE FOR CARRYING OUT THE INVENTION

An explanation will be given of various experiments according to this invention.

Experiment 1

In this experiment, the electric characteristic and surface flatness of an NiAl system ohmic contact material for a p-type 4H-SiC was examined.

As a substrate, a p-type 4H-SiC(0001) epitaxial wafer (Al concentration: $6.4$–$9.0 \times 10^{18}$ cm$^{-3}$), which is commercially available was adopted. After the substrate had been chemically washed, a thermal oxide film having a thickness of 10 nm was deposited thereon, and a circular TLM pattern was made by photolithography. After the oxide film had been removed using diluted hydrofluoric acid, Ni and Al were deposited by techniques of electron beam and resistive heating. Contact materials were made with their different thicknesses. After an electrode pattern was formed by a lift-off step, heat treatment was carried out within a super high vacuum chamber at 800° C. to 1000°. The resistivity and surface crystallinity of each sample was evaluated by circular TLM, X-ray diffraction (XRD), Rutherford backscattering spectrometry (RBS) and observation by an optical microscope.

Figure 1:
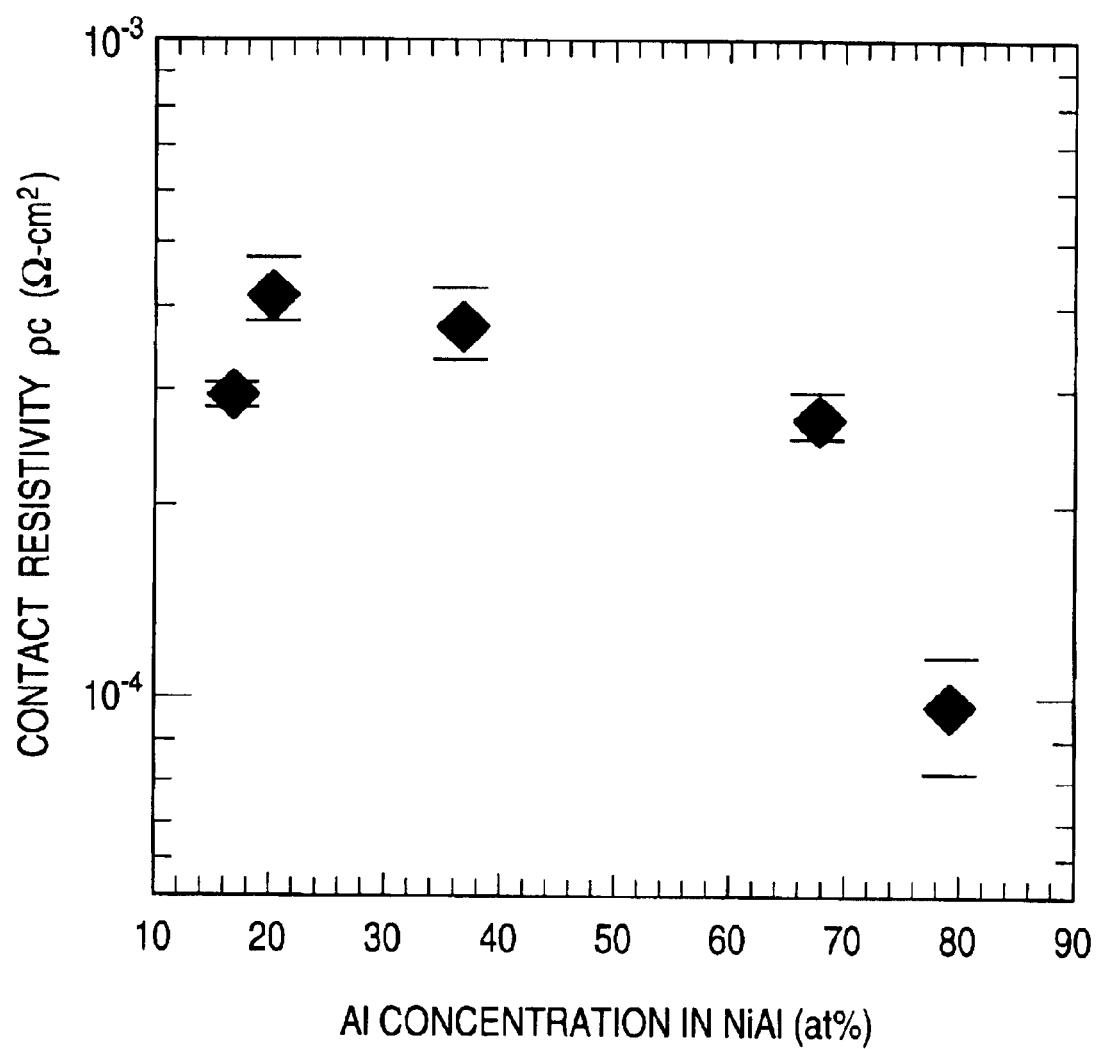
FIG. 1 is a graph showing the result of Experiment 1, which exhibits dependency of the contact resistivity ($\rho c$) after the heat treatment at 1000° C. for 2 minutes on the Al concentration in NiAl.

The NiAl contact material exhibited the ohmic property even after the heat treatment at 800° C. Namely, it was revealed that Ni adopted as one of electric materials provides the ohmic property in also the heat treatment at a lower temperature than before. FIG. 1 shows the dependency of the contact resistivity ($\rho c$) after the heat treatment at 1000° C. for 2 minutes on the Al concentration in NiAl.

As seen from FIG. 1, the NiAl contact material provides the contact resistivity $\rho c$ on the order of $10^{-4}$ Ωcm$^2$ at the concentration (40 at % or lower) lower than that of a TiAl contact material, and provides $\rho c$ of $9 \times 10^{-5}$ Ωcm$^2$ at the Al concentration of 80 at %. With an increase in the Al concentration, the contact resistivity decreases. Thus, it was confirmed that Al plays an important part in the reduction of the contact resistivity. Further, after the heat treatment at 1000° C. also, NiAl provided a flatter surface than in TiAl.

Experiment 2

In this experiment, the heat treatment temperature and electrode surface flatness of a CoAl ohmic contact material for a p-type 4H-SiC were examined.

As a substrate, a p-type 4H-SiC(0001) epitaxial wafer (Al concentration: $1.0 \times 10^{19}$ cm$^{-3}$), which is commercially available was adopted. After the substrate had been chemically washed, a thermal oxide film having a thickness of 10 nm was deposited thereon, and a circular TLM pattern was made by photolithography. After the oxide film had been removed using diluted hydrofluoric acid, metallic layers of Co and Al were deposited by techniques of electron gun deposition and resistive heating. A plurality of samples with different thicknesses of the intermediate layer in a Co/Al/Co deposition structure were made to have the entire film thickness of 180 nm. After an electrode pattern was formed by a lift-off step, heat treatment was carried out within a super high vacuum chamber for between 10 minutes at 800° C. and 2 minutes 1000° C. The resistivity and surface crystallinity of each sample was evaluated by circular TLM, X-ray diffraction (XRD), Rutherford backscattering spectrometry (RBS) and observation by optical microscope.

Figure 2:
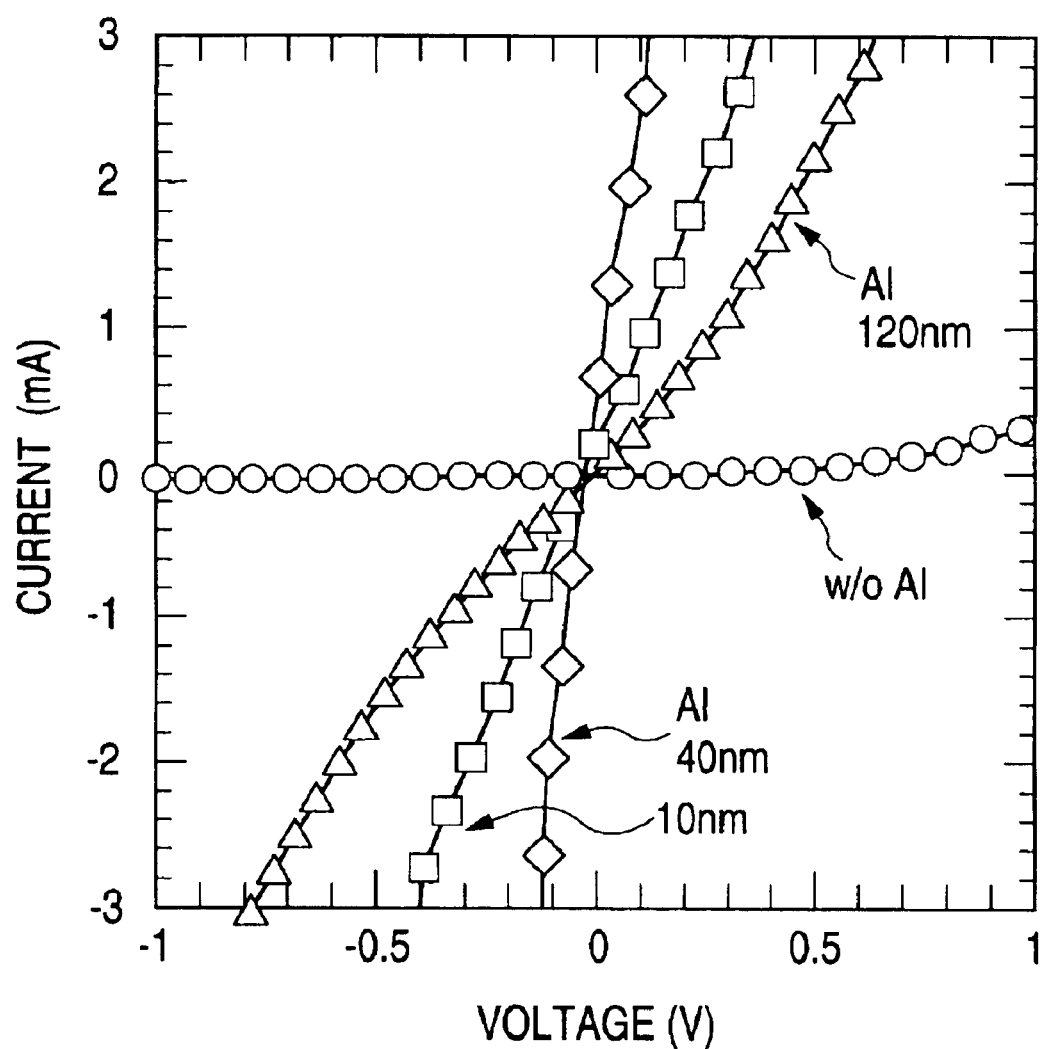
FIG. 2 is a graph showing the result of Experiment 2, which exhibits the current-voltage (I-V) characteristic of the CoAl/SiC contact after the heat treatment at 800° C. for 10 minutes.

FIG. 2 shows the current-voltage (I-V) characteristic of the CoAl/SiC contact after the heat treatment at 800° C. for 10 minutes. As seen from the graph of FIG. 2, it was confirmed that the samples having thin Al intermediate layers of 10 nm and 40 nm, respectively, provide an improved ohmic property. The heat treatment further carried out at 1000° C. for 2 minutes reduced the contact resistivity to $4 \times 10^{-4}$ $\Omega cm^2$. The CoAl contact after the heat treatment at 1000° C. also gave a very flat surface as compared with the TiAl contact. It was revealed that the Co contact material which does not includes an Al layer cannot give the ohmic property after the heat treatment at 1000° C. and hence Al plays an important part in the reduction of the contact resistivity.

Experiment 3

In this experiment, the heat treatment temperature and electrode surface flatness when Ni is employed in an ohmic contact material for a p-type 4H-SiC were examined.

As a substrate, a p-type 4H-SiC(0001) epi-wafer (Al concentration: $3.0$–$8.1 \times 10^{18}$ $cm^{-3}$), which is commercially available was adopted. After the substrate had been chemically washed, a thermal oxide film having a thickness of 10 nm was deposited thereon, and a circular TLM pattern was made by photolithography. After the oxide film had been removed using diluted hydrofluoric acid, metallic layers of Ni and Ti were deposited by the technique of electron beam, and an Al metallic layer was deposited by resistive heating. The laminated structure was made for each sample of Ti/Al (Ti layer and Al layer are stacked in order from the side of SiC. The same shall apply hereinafter), Ni/Al and Ni/Ti/Al. For Ni/Ti/Al, a plurality of samples with different thicknesses of the Ni layer and Ti layer were made. Incidentally, the vacuum degree during the deposition was set at $1 \times 10^{-6}$ Torr. After an electrode pattern was formed by a lift-off step, heat treatment was carried out within a super high vacuum chamber for 5 to 30 minutes at 800° C. The resistivity and surface crystallinity of each sample was evaluated by circular TLM, X-ray diffraction (XRD), Rutherford backscattering spectrometry (RBS) and observation by an optical microscope.

Figure 3:
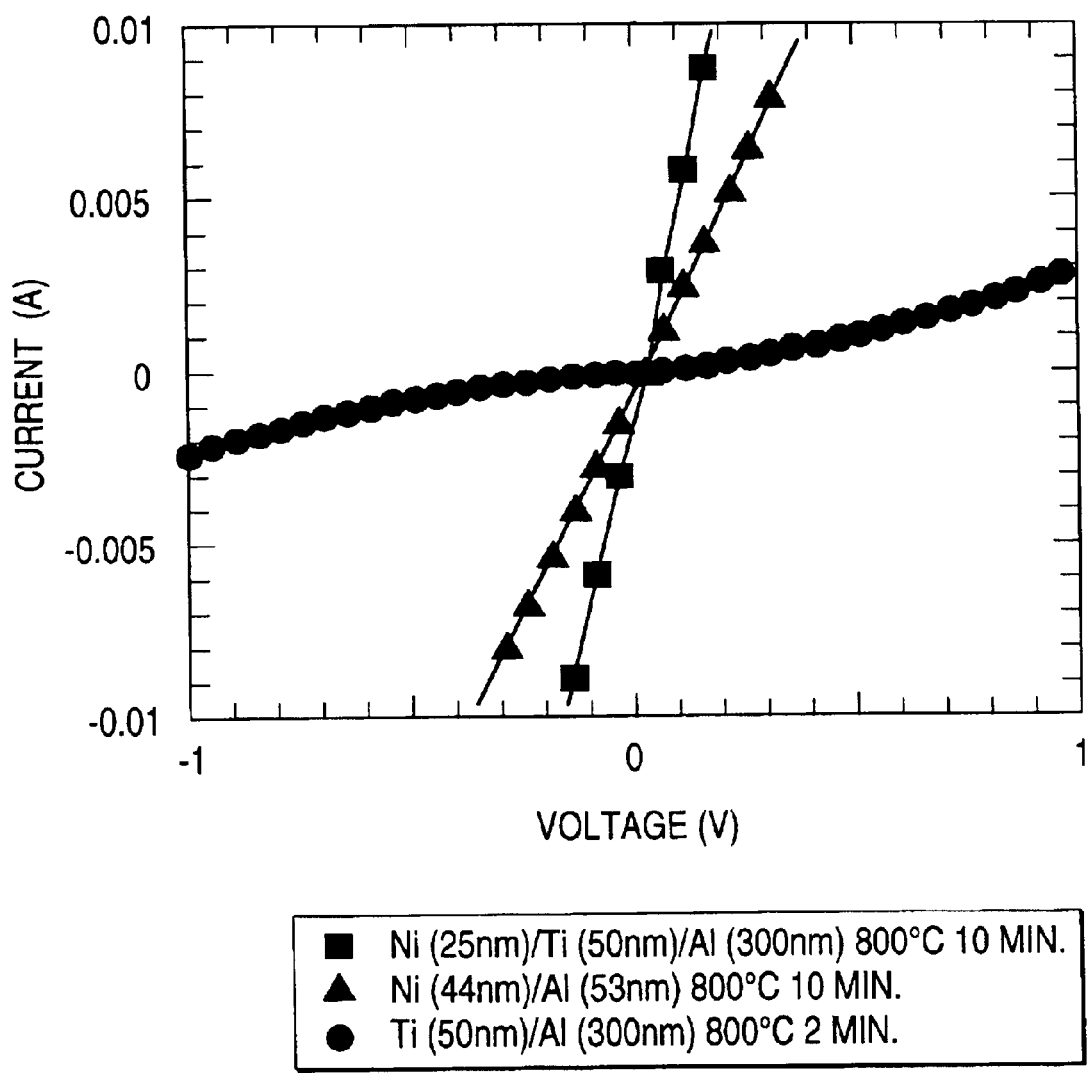
FIG. 3 is a graph showing the result of Experiment 3, which exhibits the current-voltage (I-V) characteristics of the respective samples (Ti/Al, Ni/Al, Ni/Ti/Al) after the heat treatment at 800° C. for 10 minutes.

FIG. 3 shows the current-voltage (I-V) characteristics of the respective samples (Ti/Al, Ni/Al, Ni/Ti/Al) after the heat treatment at 800° C. for 10 minutes.
■: Ni (25 nm)/Ti(50 nm)/Al(300 nm), 800° C., 10 min,
▲: Ni (44 nm)/Al(53 nm), 800° C., 10 min,
●: Ti (50 nm)/Al(300 nm) 800° C., 2 min.

As seen from FIG. 3, for the sample of Ti/Al, the heat treatment at 800° C. did not gave the ohmic property, whereas for the samples (Ni/Al, Ni/Ti/Al) including the Ni layer, the heat treatment at 800° C. gave the ohmic property. In other words, it was confirmed that provision of the Ni layer permits the ohmic contact to be formed by the heat treatment at a lower temperature than before. Further, the surface of each of NiAl and Ni/Ti/Al after the heat treatment was very flat.

FIG. 4 shows the relationship between the film thickness of a Ni layer and Ti layer and the contact resistivity ($\rho c$) in a sample having a laminated structure of Ni/Ti/Al.
△: Ni(8 nm)/Ti(50 nm)/Al(300 nm)
◇: Ni(15 nm)/Ti(50 nm)/Al(300 nm)
▲: Ni(25 nm)/Ti(50 nm)/Al(300 nm) (the above samples have Al concentration of $3.0 \times 10^{18}$ $cm^{-3}$)
●: Ni(8 nm)/Ti(50 nm)/Al(300 nm)
○: Ni(15 nm)/Ti(50 nm)/Al(300 nm) (the above samples have Al concentration of $8.1 \times 10^{18}$ $cm^{-3}$)

It was revealed that an increase in the thickness of the Ni layer reduces the resistivity, i.e. the resistivity depends on the thickness of the Ni film. Incidentally, the condition of Ni(25 nm)/Ti(50 nm)/Al(300 nm) realized $\rho c = 6.64 \times 10^{-5}$ $\Omega cm^2$.

An explanation will be given of an embodiment of this invention.

FIG. 5 is a schematic view of the structure of an SiC device 1 according to an embodiment of this invention.

The SiC device can be manufactured by the following process.

First, an n-type SiC substrate 10 is placed in a vapor-phase growing apparatus chamber. Using hydrogen gas as a carrier gas, monosilane ($SiH_4$) and propane ($C_3H_8$), which are a raw gas, and trimethylaluminum(($CH_3$)Al),which is an impurity gas, are supplied into the chamber to form a p-type SiC layer 11 having a thickness of about 5 $\mu m$ at a growing temperature at about 1400° C. Incidentally, the p-type SiC layer 11 can be also formed by known molecular beam epitaxy (MBE), halide vapor phase epitaxy (HVPE), sputtering, ion-plating, electron shower, etc.

The substrate 10 is subjected to sacrificial oxidation in an atmosphere of $O_2$ for 60 minutes at 1150° C. to deposit an $SiO_2$ film 12 having about 10 nm on the surface of the p-type SiC layer 11. After electrode patterning by photolithography is performed, a part of the $SiO_2$ film is removed using diluted hydroflouric acid. Subsequently, an Ni layer 21 having a thickness of about 25 nm is formed by the electron beam method. Likewise, a Ti layer 22 is formed by the electron beam method and an Al layer 23 is formed by the resistive heating. Thereafter, an electrode pattern is formed by a lift-off step. Through the process described above, a p-type electrode 20 composed of Ni, Ti, and Al which have been stacked in order is manufactured as shown in FIG. 5.

Next, in order to make an ohmic contact between the p-type SiC layer 11 and the p-type electrode 20, heat treatment is carried out in the super high vacuum chamber for 10 minutes at 800° C.

Subsequently, an n-type electrode 30 which is composed of vanadium (V) and aluminum (Al) is formed on the surface of the n-type SiC substrate 10 by vapor deposition. Upon completion of the process described above, the step of separating the chip is carried out using a scriber to provide the SiC device 1.

This invention has been hitherto described in detail and with reference to a specific embodiment. However, it is apparent to those skilled in the art that various changes or modifications can be made without departing from the spirit and scope of this invention.

This application is based on Japanese Patent Application No. 2001-270771 filed on Sep. 6, 2001 and its contents are incorporated hereby by reference.

INDUSTRIAL APPLICABILITY

This invention should not be limited to the embodiment described above. This invention includes various embodiments within a range which does not deviate from the scope of claim and can be easily anticipated by those skilled in the art. Further, it is needless to say that this invention can be applied to other semiconductor devices using SiC, e.g. III-group nitride compound semiconductor on SiC.

What is claimed is:

1. An electrode for p-type SiC, comprising:
   a first electrode material of at least one member selected from the group consisting of nickel (Ni), cobalt (Co), palladium (Pd) and platinum (Pt);
   a second electrode material of aluminum (Al), said second electrode material comprising a thickness of 50 nm; and a third electrode material of titanium (Ti), said third electrode material comprising a thickness of 300 nm, wherein a thickness of said first electrode material is selected for providing a desired contact resistivity for said electrode.

2. An electrode for p-type SiC according to claim 1, wherein said first electrode material comprises one of Ni and Co.

3. An electrode for p-type SiC arcording to claim 1, wherein said first electrode material is formed in contact with a p-type SiC layer.

4. An SiC device, wherein the electrode for p-type SiC described in claim 1 is formed on a p-type SiC layer.

5. The electrode for p-type SiC according to claim 1, wherein a heating temperature for said p-type SiC to form an ohmic contact comprises a temperature of 600° C. to 900° C.

6. The electrode for p-type SiC according to claim 5, wherein said heating temperature comprises a temperature of 700 ° C. to 850° C.

7. A SiC device comprising:

a p-type SiC layer;

an electrode comprising a first electrode material selected from the group consisting of nickel (Ni), cobalt (Ca), palladium (Pd), and platinum (Pt); and a SiO$_2$ film deposited on and in contact with said first surface of said p-type SiC layer, wherein a thickness of said first electrode material is selected for providing a desired contact resistivity for said electrode.

8. The SiC device according to claim 7, further comprising:

a second electrode material of aluminum (Al) formed on said first electrode material.

9. The SiC device according to claim 8, further comprising:

a third electrode material of titanium (Ti) formed on said second electrode material.

10. The SiC device according to claim 7, wherein a heating temperature for said p-type SiC layer to form an ohmic contact comprises a temperature of 600° C. to 900° C.

11. The SiC device according to claim 10, wherein said heating temperature comprises a temperature of 700° C. to 850° C.

* * * * *